United States Patent [19]
Hrbacek et al.

[11] 4,001,695
[45] Jan. 4, 1977

[54] AUTOMATIC DEVIATION ANALYSIS METER

[75] Inventors: Benny A. Hrbacek; Lewis F. Grovenstein, Jr., both of Concord, Calif.

[73] Assignee: Systron Donner Corporation, Concord, Calif.

[22] Filed: Mar. 24, 1975

[21] Appl. No.: 561,091

[52] U.S. Cl. .............................. 325/363; 324/77 C
[51] Int. Cl.[2] ...................................... G01R 23/16
[58] Field of Search .................. 331/177 V, 178; 324/78 R, 77 C, 77 CS; 325/134, 333, 335, 420, 421, 422, 423, 470

[56] References Cited
UNITED STATES PATENTS

| | | |
|---|---|---|
| 3,217,255 | 11/1965 | Broadhead, Jr. et al. ..... 325/420 X |
| 3,369,236 | 2/1968 | Westerfield et al. .......... 325/470 X |
| 3,447,084 | 5/1969 | Haner et al. .................. 325/421 X |
| 3,541,449 | 11/1970 | Broderick et al. ............. 325/335 |

*Primary Examiner*—Benedict V. Safourek
*Attorney, Agent, or Firm*—Flehr, Hohbach, Test, Albritton & Herbert

[57] ABSTRACT

A system for automatically measuring frequency deviation without manual tuning or frequency selection includes a transfer oscillator circuit which is switchable between fast and slow loop response modes by use of a squelch indication. In addition, a varactor in the voltage controlled oscillator is conditionally operated in the less sensitive portion of its tuning range. This is accomplished by inhibiting the squelch, thus preventing a frequency lock in the undesired portion of the varicap tuning range when the higher frequencies are applied to the input.

6 Claims, 2 Drawing Figures

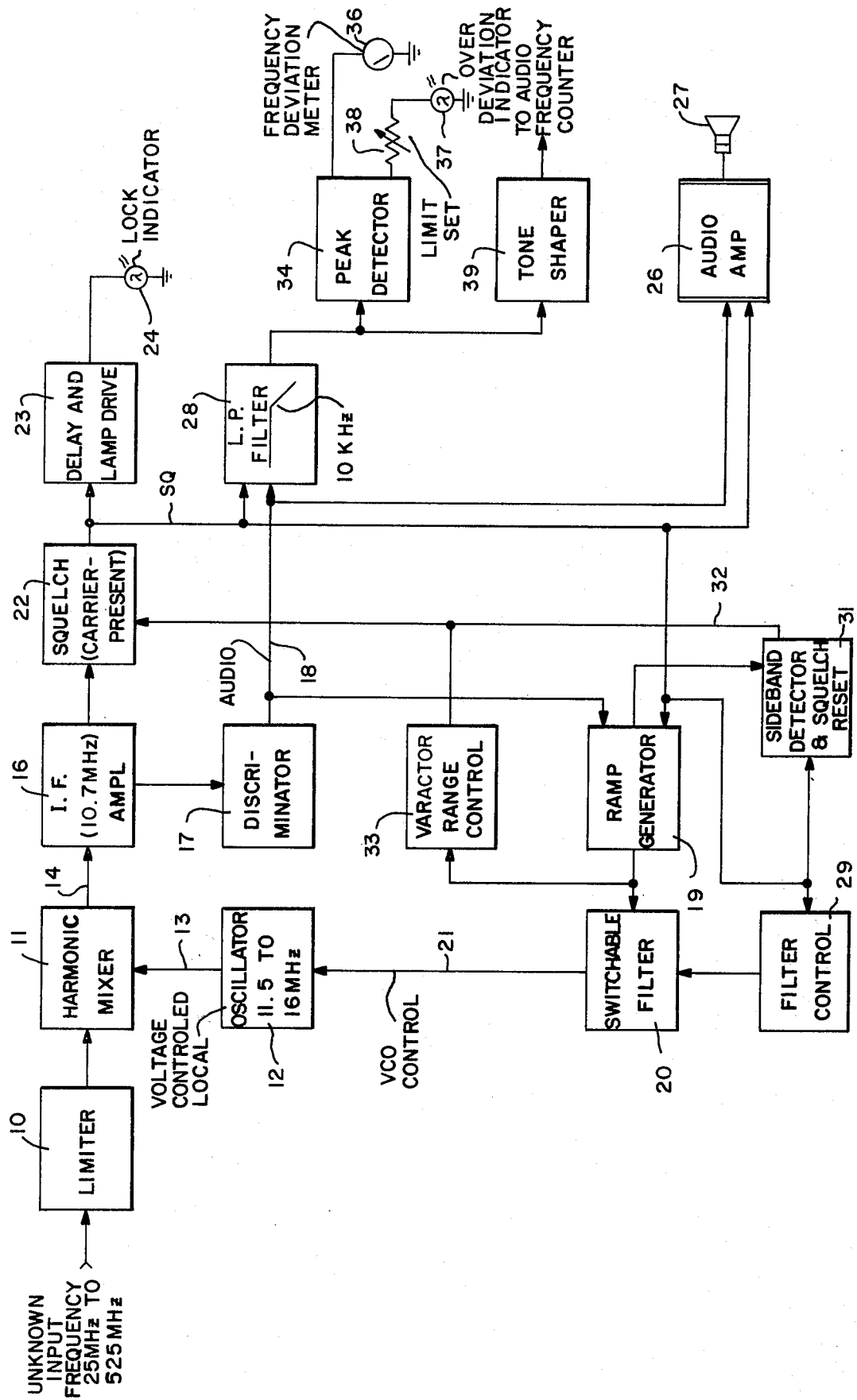
FIG.—1

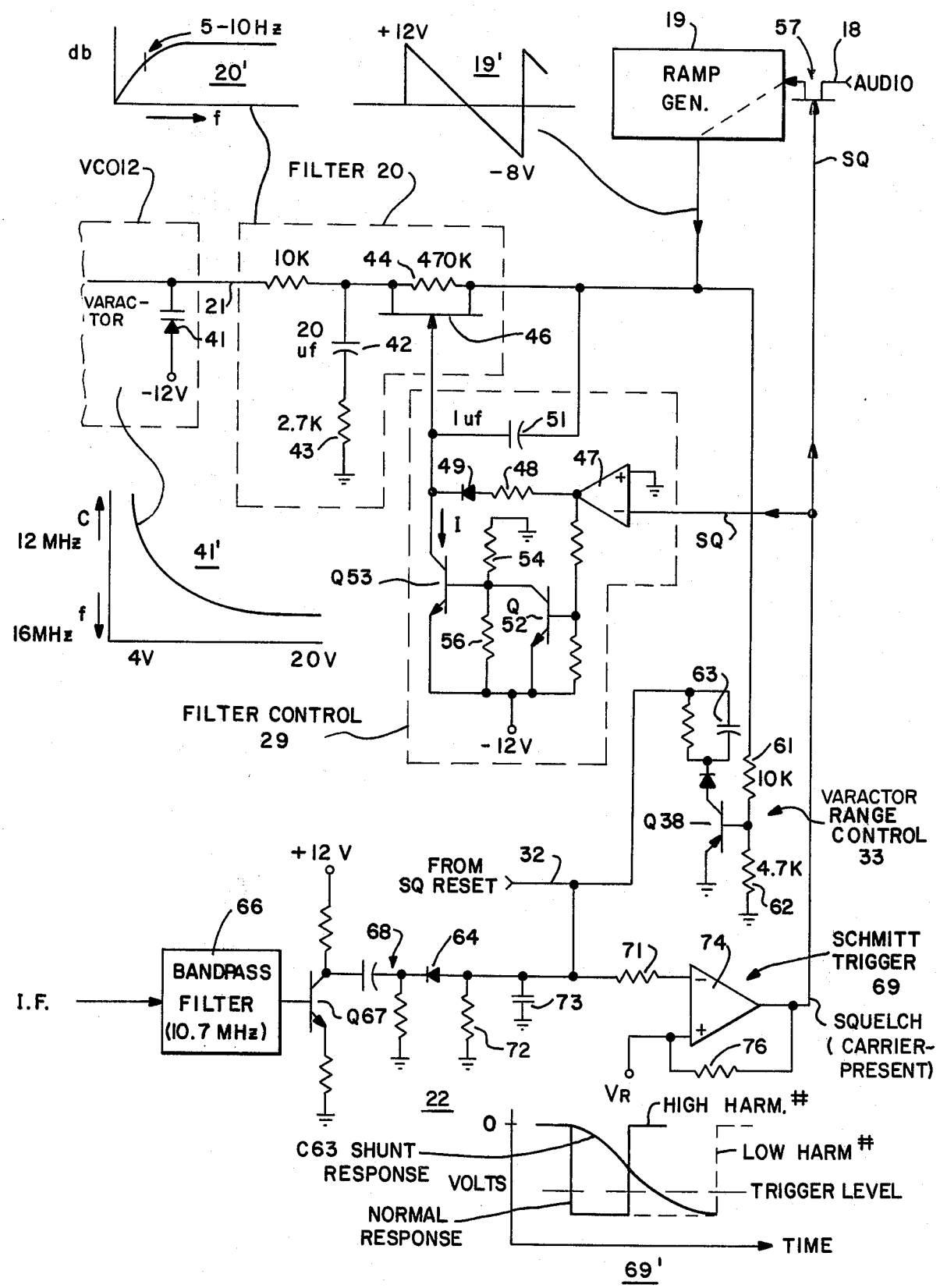
FIG.—2

AUTOMATIC DEVIATION ANALYSIS METER

BACKGROUND OF THE INVENTION

The present invention is directed to an automatic deviation analysis meter for indicating the frequency deviation of an unkown frequency modulated carrier signal.

It is necessary to frequently test the operation of private radio networks in order to comply with government regulations. In the case of a frequency modulation (FM) type network the frequency deviation of the carrier signal must be kept within a certain range.

Present frequency deviation measuring instruments require the manual "dialing-in"or selection of the carrier frequency to be tested.

This is a cumbersome procedure where the exact carrier frequency may be unknown or several different carrier frequencies are to be tested. Also prior measuring instruments required a relatively skilled operator.

OBJECTS AND SUMMARY OF THE INVENTION

It is, therefore, a general object of the present invention to provide an improved automatic deviation analysis meter.

It is a more specific object to provide a meter which automatically measures the frequency deviation of an unknown carrier signal without manual tuning or frequency selection.

In accordance with the above objects there is provided an automatic deviation analysis meter for indicating the frequency deviation of an unknown frequency modulated carrier signal. Automatic transfer oscillator means include a harmonic mixer and voltage controlled oscillator (VCO) which produces a local oscillator (L.O.) signal. A negative feedback loop includes the harmonic mixer coupled to and responsive to the L.O. signal to produce an intermediate frequency (I.F.) signal. The loop also includes a discriminator coupled to the harmonic mixer and responsive to the I.F. signal for producing a d.c. voltage determined by any I.F. signal frequency change. The d.c. voltage drives the VCO after acquisition of the carrier signal. Search means scan the VCO during a scanning mode and before acquisition of the carrier signal. Means are provided for controlling the frequency response to the loop and are responsive to acquisition of the carrier signal for providing a relatively slow loop response to maintain the L.O. signal substantially constant with relatively low audio frequency modulation of the acquired carrier. Such means also couple the search means to the VCO during scanning and provide a fast response.

BRIEF DESCRIPTION OF THE DRAWINGS

FIG. 1 is a block diagram embodying the present invention; and

FIG. 2 is a simplified circuit schematic of portions of FIG. 1.

DETAILED DESCRIPTION OF THE PREFERRED EMBODIMENT

Referring now to FIG. 1, an unknown input frequency as, for example, 25 MHz to 525 MHz is limited by a limiter 10 and mixed in a harmonic mixer 11. Mixer 11 generates any of several harmonics of a voltage controlled local oscillator 12 (VCO) with the local oscillator (L.O.) signal itself appearing on line 13. Harmonic mixer 11 produces on its output line 14 an intermediate frequency (I.F.) which in the present invention is the standard radio communication I.F. frequency of 10.7 MHz. This is processed by I.F. amplifier means 16 which, for example, may include a bandpass filter centered around the I.F. frequency. The I.F. frequency is, to restate the effect of the harmonic mixer, a frequency signal which is the difference between the local oscillator signal on line 13 which has been multiplied by harmonic mixer 11 and the input signal.

The discriminator 17 is responsive to the I.F. amplifier 16 to produce on line 18 a demodulated audio or effective d.c. driving voltage which has an amplitude and polarity determined by the frequency changes in the I.F. if it deviates from its nominal 10.7 MHz. This d.c. or audio voltage on line 18 drives the VCO through a ramp generator 19 and a switchable filter 20 to provide on line 21 a VCO control signal to VCO unit 12.

Ramp generator 19 may also be characterized as a search oscillator which initially in a scanning mode sweeps the VCO 12 until the selected I.F. frequency signal is reached whereupon the search oscillator is overridden as will be discussed below and the VCO 13 is tuned to an exact submultiple of the RF input frequency signal with the I.F. offset.

What has thus far been described with the exception of the switchable filter 20 is an autmtic transfer oscillator. Such oscillators are well known in the art as shown in U.S. Pat. No. 3,781,678 which is assigned to the present assignee. That patent however is directed to providing measurement of RF frequency. It also has as an object improved FM tolerance which means that the negative feedback loop circuit follows as closely as is possible the FM frequency deviation of the carrier signal.

In contrast, in the present invention it is desired that the signal produced on line 18 is a faithful representation of the initial audio frequency which frequency modulates the unknown carrier in order that the peaks of the audio frequency may be accurately measured to provide frequency deviation information. Thus, to provide such accurate audio information on line 18 VCO 12 which is in essence the local oscillator must not follow relatively low audio or effective d.c. frequencies. In other words, the loop response must be relatively slow. However, a conflicting requirement is that in view of the transfer oscillator requirement of the invention—that is, that the circuit be capable of rapidly sweeping over the unknown frequency spectrum to detect an unknown carrier—there must be a fast response time. Lastly, no undesirable transients can be tolerated in the control loop. As will be discussed below, switchable filter 20 is one of the important circuit components to provide the foregoing.

Continuing with the block diagram of FIG. 1, a squelch circuit 22 is responsive to the presence of an IF signal from unit 16 to indicate that a carrier frequency is present. Squelch unit 22 produces an output on the line designated SQ which gates the following circuits. These include the ramp generator 19, a delay and lamp drive unit 23 which means of a light 24 provides a lock indication or a carrier present indication, an audio amplifier 26 having a speaker 27, a low pass filter 28, and a filter control switch 29 which drives switchable filter 20. In addition, the squelch output drives a sideband detector and squelch reset unit 31 which is well-known in the art of transfer osclIator circuits and prevents an unstable state due to locking onto the wrong sideband of a signal. If the circuit does lock on the wrong sideband an output on line 32 resets the carrier present or squelch indication SQ. A varactor range control unit 33 also controls the squelch indication, which will be discussed below, to effectively control the frequency range in which the VCO 12 operates. Such VCO also includes a varactor to produce its range of output frequencies on line 13.

Low pass filter 28 has a rolloff at 10 kHz since audio frequencies above that are not of interest. The output of filter 28 drives a peak detector 34 which provides by definition the frequency deviation of the unknown carrier signal which is read out on a frequency deviation meter 36. In addition, an over deviation light indicator 37 in combination with a limit set potentiometer 38 indicates if the frequency deviation is over a desired limit.

A tone shaper unit 39 takes the output of filter 28 to provide a digital indication by means of an audio frequency counter (not shown) of the audio frequency.

In operation in the circuit of FIG. 1, the search oscillator or ramp generator 19 first causes the VCO 12 to scan, for example, from 11.5 to 16 MHz to detect an unknown carrier frequency. The I.F. of such frequency is detected by the squelch unit 22. Acquisition of the frequency is brought about by squelch unit 22 overriding ramp generator 19 to convert the negative feedback loop, which includes I.F. unit 16, discriminator 17, filter 20 and VCO 12, to a condition which locks on the I.F. frequency. However, due to switchable filter 20, also actuated by the squelch indication, the response of the loop is slowed so that a true audio frequency signal will appear on line 18 from discriminator 17. Thus, the circuit has in essence a dual rolloff loop response.

Now referring to FIG. 2 the basic frequency of voltage controlled oscillator 12 is determined by a variable capacitor or varactor 41 with one side tied to the VCO control input line 21 and the other side to a −12 volt voltage source. As shown by the characteristic 41', as the voltage across the varactor is increased from 4 volts toward 20 volts the capacitance decreases and the effective frequency of the VCO increases from 12 MHz to 16 MHz. As is also apparent from the characteristic the less voltage sensitive operating portion of the varactor characteristic is in its higher frequency range. If it is desired to operate the varactor in this less voltage sensitive high frequency range, the associated harmonic mixer 11 (FIG. 1) would operate at relatively lower harmonic numbers to provide the same I.F. signal.

VCO 12 is driven by switchable filter 20 which is of a typical L configuration with a capacitor 42 shunted to ground through a resistor 43 and with the other leg of the L consisting of a resistor 44. Approximate values are shown for the components. With the resistor 44 in the filter arrangement the overall response of the negative feedback loop is relatively slow. This is illustrated by the characteristic 20' which shows a rolloff at a point of of 5 to 10 Hz. With this slow response as discussed above, the VCO 12 is, therefore, unresponsive to error signals above this rolloff point. Thus, a 50 Hz modulating voltage on the input carrier signal will not affect the negative feedback loop and the VCO will not follow the frequency deviation produced by the audio modulating voltage.

From an operational standpoint and depending on the application a rolloff point of substantially greater than 50 Hz would not be practical.

However, in accordance with the invention in order to provide for a relatively fast response during the search mode of the ramp generator 19 before the unknown carrier is acquired, filter 20 is switchable by means of a field effect transistor 46 which has its source and drain terminals connected across resistor 44. Activation of the field effect transistor shorts out resistor 44 and filter 20 now has a relatively fast response. In this acquisition or scan mode, ramp generator 19 has a characteristic 19' between +12 volts and −8 volts to effectively drive the VCO 12, since it has a −12 volt supply on its opposite end, between 4 volts and 24 volts.

The gate terminal of field effect transistor 46 is driven by filter control unit 29. During the scan or acquisition mode, the SQ or squelch, carrier presence, indication is lacking and the field effect transistor 46 should be in an on or conductive condition to provide a fast response. Thus a positive output is present on the operational amplifier 47 which drives the gate input through a resistor 48 and diode 49. This output also charges a capacitor 51 which is connected between the gate input and the output of ramp generator 19. Since amplifier 47 has a positive output the transistor Q52 is placed in an on condition with the driven transistor Q53 in an off condition. Transistor Q53 with its associated resistors 54 and 56 forms a current source designated by I which would tend to negatively charge capacitor 51 when Q53 is on.

When a squelch (SQ) indication is received (with one exception as will be detailed below) a field effect transistor 57 is activated to override the ramp generator 19 so that its output now includes the d.c. audio control voltage on line 18 from the discriminator 17. The overriding is indicated by the dashed line through the ramp generator. The SQ signal also appears at the negative input to operational amplifier 47 so that the amplifier has a negative output to thereby turn off Q52 and turn Q53 on thereby activating current source I which tends to negatively charge capacitor 51. However, as is obvious this is not an instantaneous function and the capacitor 51 takes some time to charge. During this time the input to switching transistor 46 is gradually changed so that transistor 46 slowly changes from a conductive to a non-conductive state allowing time for capacitor 42 to stabilize on the audio signal from discriminator 17. After this transistion where transistor 46 becomes nonconductive the resistor 44 is thereby in the filter circuit to provide the slow response characteristic illustrated by 20'.

Thus, in operation capacitor 42 of the filter is continuously between the driving line 21 to the VCO and ground. Transients are prevented by providing a time delay when the filter is switched from its fast response mode to its slow response mode when a signal is acquired. At the same time if a signal is lost, the SQ indication is no longer present and an output from amplifier 47 will immediately switch the filter to its fast response mode to allow scanning to immediately start.

As also discussed previously by way of exception, by means of the varactor range control 33, a squelch or carrier presence indication is inhibited if the varactor is operating in a noisier or more voltage sensitive lower frequency range as illustrated by the characteristic 41'. Varactor range control 33 is shown in greater detail in FIG. 2 and includes a transistor Q58 having its base input driven by the output of ramp generator 19. The base input resistor tree 61, 62 provides for activation of Q58 whenever the ramp characteristic 19' is less than −2 volts. This means that the voltage across the varactor is 10 volts which is outside the beginning of its more voltage sensitive range. An on condition of Q58 causes the associated capacitor 63 to be shunted across a rectfier 64 in the squelch circuit 22 to prevent the generation of a squelch signal.

Referring more specifically to the details of squelch circuit 22 the I.F. signal received from I.F. amplifier 16 passes through a second bandpass filter 66 to provide a much sharper bandpass characteristic due to the multiplying effect. The output of filter 66 drives a transistor Q67 whose collector is connected to rectifier 64 through an RC circuit 68. The other side of rectifier 64 is coupled to a Schmitt trigger unit 69 through a series resistor 71 and a parallel resistor 72 and a capacitor 73. Trigger 69 includes the operational amplifier 74, a feedback resistor 76 and a voltage reference of $V_R$. A predetermined trigger level is provided as shown by the characteristic 69'. When the presence of an I.F. signal is detected as indicated by the characteristic of 69', Q67 is made conductive to start the charge of capacitor 73. It is apparent that the faster the capacitor is charged the sooner the trigger level will be reached and Schmitt trigger 69 fired to provide the squelch or carrier present indication. As indicated by the characteristic 69' a high harmonic number I.F. frequency has a relatively short pulse interval and a low harmonic number a longer pulse interval. It is the low harmonic numbers which are desirable since the less voltage sensitive portion of the VCO is at its higher frequencies. A slower charging of the capacitor 73 will provide a squelch indication only on lower harmonic numbers produced by the harmonic mixer since the shorter high harmonic pulse will have ended before the trigger level is reached. This means is provided by the activation of Q38 in response to a ramp of less than −2 volts so that capacitor 63 of the varactor range control unit 33 shunts the rectifier 64.

Thus, the present invention has provided an automatic deviation analysis meter which scans a certain frequency spectrum and when a carrier is present automatically locks onto the carrier and provides a reading of frequency deviation by a meter. No tuning or manual adjustment of the circuit is necessary.

What is claimed is:

1. An automatic deviation analysis meter for indicating the frequency deviation of an unknown frequency modulated carrier signal comprising: automatic transfer oscillator means including a harmonic mixer, a voltage controlled oscillator (VCO) for producing a local oscllator (L.O.) signal, a negative feedback loop including said harmonic mixer coupled to and responsive to the L.O. signal of said VCO to produce an intermediate frequency (I.F.) signal, said loop including a discriminator coupled to said harmonic mixer and responsive to said I.F. signal for producing a d.c. voltage determined by any I.F. signal frequency change, said d.c. voltage driving said VCO after acquisition of said carrier signal; search means for scanning said VCO during a scanning mode and before acquisition of said carrier signal; means for controlling the frequency response of said loop and responsive to acquisition of said carrier signal for providing a relatively slow loop response to maintain the L.O. signal substantially constant with relatively low audio frequency modulation on said acquired carrier such means also coupling said search means to said VCO during said scanning mode and providing a fast response.

2. An automatic deviation analysis meter as in claim 1 where said controlling means include low pass filter means having a rolloff frequency or less than 50 Hz for filtering said d.c. driving voltage for providing said slow loop response.

3. An automatic deviation analysis meter as in claim 1 together with means coupled to said harmonic mixer for signalling the presence of said carrier signal during said scanning.

4. An automatic deviation analysis means as in claim 3 together with means for inhibiting said carrier presence means in response to said VCO producing a local oscillator signal in a predetermined frequency range.

5. An automatic deviation analysis meter as in claim 4 where said inhibiting means is responsive to said harmonic mixer operating at a relatively high harmonic number to produce said I.F. signal for inhibiting said carrier presence means.

6. An automatic deviation analysis meter as in claim 3 where said controlling means includes filter means for filtering said d.c. driving voltage and for coupling said search means to said VCO said filter means being switchable between fast and slow response modes said controlling means being responsive to said carrier presence signal means for gradually switching to said slow response mode to allow said filter means to stabilize.

* * * * *